United States Patent
Chu et al.

(10) Patent No.: US 7,452,739 B2
(45) Date of Patent: Nov. 18, 2008

(54) METHOD OF SEPARATING SEMICONDUCTOR DIES

(75) Inventors: Chen-Fu Chu, Hsinchu (TW); Trung Tri Doan, Baoshan Township (TW); Hao-Chun Cheng, Donggang Township, Pingtung County (TW); Feng-Hsu Fan, Jhonghe (TW); Fu-Hsien Wang, Sinpu Township, Hsinchu County (TW)

(73) Assignee: Semi-Photonics Co., Ltd., Chu-nan (TW)

( * ) Notice: Subject to any disclaimer, the term of this patent is extended or adjusted under 35 U.S.C. 154(b) by 8 days.

(21) Appl. No.: 11/682,814

(22) Filed: Mar. 6, 2007

(65) Prior Publication Data
US 2007/0212854 A1 Sep. 13, 2007

Related U.S. Application Data

(60) Provisional application No. 60/780,896, filed on Mar. 9, 2006.

(51) Int. Cl.
*H01L 21/48* (2006.01)

(52) U.S. Cl. .................. 438/33; 438/113; 438/462; 438/464; 257/E21.175; 257/E21.479; 257/E21.238

(58) Field of Classification Search .............. 438/33, 438/113, 464, 462; 257/E21.175, E21.479, 257/E21.238
See application file for complete search history.

(56) References Cited

U.S. PATENT DOCUMENTS

| | | | | | |
|---|---|---|---|---|---|
| 3,913,217 | A | * | 10/1975 | Misawa et al. | 438/464 |
| 4,640,739 | A | * | 2/1987 | Modic et al. | 216/48 |
| 5,300,788 | A | * | 4/1994 | Fan et al. | 257/13 |
| 5,453,405 | A | * | 9/1995 | Fan et al. | 438/34 |
| 5,882,986 | A | * | 3/1999 | Eng et al. | 438/456 |
| 6,403,985 | B1 | * | 6/2002 | Fan et al. | 257/88 |
| 6,458,619 | B1 | | 10/2002 | Irissou | |
| 6,846,692 | B2 | * | 1/2005 | Silverbrook | 438/51 |
| 2002/0093076 | A1 | * | 7/2002 | Fujii et al. | 257/620 |
| 2003/0020084 | A1 | * | 1/2003 | Fan et al. | 257/92 |
| 2003/0134453 | A1 | * | 7/2003 | Prabhu et al. | 438/113 |
| 2005/0167798 | A1 | | 8/2005 | Doan | |
| 2005/0269700 | A1 | | 12/2005 | Farnworth et al. | |

(Continued)

OTHER PUBLICATIONS

PCT International Search Report and Written Opinion dated Oct. 17, 2007.

*Primary Examiner*—George Fourson
(74) *Attorney, Agent, or Firm*—Patterson & Sheridan, LLP

(57) ABSTRACT

A method for the separation of multiple dies during semiconductor fabrication is described. On an upper surface of a semiconductor wafer containing multiple dies, metal layers are deposited everywhere except where a block of stop electroplating material exists. The stop electroplating material is obliterated, and a barrier layer is formed above the entire remaining structure. A sacrificial metal element is added above the barrier layer, and then the substrate is removed. After the semiconductor material between the individual dies is eradicated, any desired bonding pads and patterned circuitry are added to the semiconductor surface opposite the sacrificial metal element, a passivation layer is added to this surface, and then the sacrificial metal element is removed. Tape is added to the now exposed barrier layer, the passivation layer is removed, the resulting structure is flipped over, and the tape is expanded to separate the individual dies.

39 Claims, 23 Drawing Sheets

U.S. PATENT DOCUMENTS

2005/0272257 A1    12/2005  Fuchs et al.
2007/0184583 A1 *   8/2007  Egawa ........................ 438/113
2007/0284681 A1 *  12/2007  Massieu et al. ............. 257/415

* cited by examiner

METHOD OF SEPARATING SEMICONDUCTOR DIES

CROSS-REFERENCE TO RELATED APPLICATIONS

This application claims benefit of U.S. Provisional Patent Application Ser. No. 60/780,896, filed Mar. 9, 2006, which is herein incorporated by reference.

BACKGROUND OF THE INVENTION

1. Field of the Invention

Embodiments of the present invention generally relate to a method of semiconductor fabrication and, more particularly, to a method of separating multiple semiconductor dies.

2. Description of the Related Art

A wide variety of electronic devices, ranging from microprocessors to light-emitting diode (LED) structures, are typically formed in relatively large numbers as die on semiconductor wafer substrates. After formation, the devices must be separated for final packaging, typically via mechanical saw, "scribing and break," or laser.

In many cases, the devices must be placed on some type of device for final assembly, such as a tape allowing manipulation of the devices by a machine, such as a robot used in automated assembly. Due to the delicate nature of the unpackaged devices, handling the devices in preparation of separation or during the separation process presents a challenge.

Accordingly, what is needed is a process to efficiently separate dies.

SUMMARY OF THE INVENTION

One embodiment of the present invention is a method of fabricating a plurality of semiconductor dies. The method generally includes forming one or more semiconductor layers on a substrate; defining the plurality of semiconductor dies separated by streets in the semiconductor layers; depositing one or more metal layers above the semiconductor layers; removing at least a portion of the metal layers disposed in the streets; forming a first handling layer above the metal layers; removing the substrate to expose a surface of the semiconductor layers; adding a second handling layer to the exposed surface of the semiconductor layers; removing the first handling layer to expose a surface of the metal layers; applying an adhesive to the exposed surface of the metal layers; and removing the second handling layer.

Another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more metal layers above the semiconductor layers; depositing a barrier layer above the metal layers; removing at least a portion of the barrier layer and the metal layers disposed in the streets; forming a first handling layer above the barrier layer; removing the substrate to expose a surface of the semiconductor layers; adding a second handling layer to the exposed surface of the semiconductor layers; removing the first handling layer to expose the barrier layer; applying an adhesive to the barrier layer; and removing the second handling layer.

Yet another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more connected conductor layers above the semiconductor layers; forming stop electroplating (EP) areas in the streets; depositing one or more metal layers above the connected conductor layers, wherein the stop EP areas discourage metal deposition in at least portions of the streets; removing the stop EP areas; removing at least a portion of the connected conductor layers disposed in the streets; forming a first handling layer above the metal layers; removing the substrate to expose a surface of the semiconductor layers; adding a second handling layer to the exposed surface of the semiconductor layers; removing the first handling layer to expose a surface of the metal layers; applying an adhesive to the exposed surface of the metal layers; and removing the second handling layer.

Yet another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more connected conductor layers above the semiconductor layers; forming stop EP areas in the streets; depositing a plurality of metal layers above the connected conductor layers, wherein the stop EP areas discourage metal deposition in at least portions of the streets; removing the stop EP areas; depositing a barrier layer to protect the connected conductor layers and the metal layers; and removing the substrate to expose a surface of the semiconductor layers. Using this method, only the connected conductor layers may need to be cut through to separate the dies versus have to cut through thick metal layers. In this manner, the total thickness of the semiconductor dies dictated by packaging and the thickness of the street required for handling the semiconductor dies after the substrate is removed may be independently optimized.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and structures useful for separating multiple semiconductor dies present on a wafer. This method can be applied to any semiconductor wafer with multiple dies, and the case of separating multiple vertical light-emitting diode (VLED) dies is provided as an example. In the figures that follow, only two dies are shown, but this is representative of multiple dies on the entire wafer.

An Exemplary Method of Separating Semiconductor Dies

Figure 1:
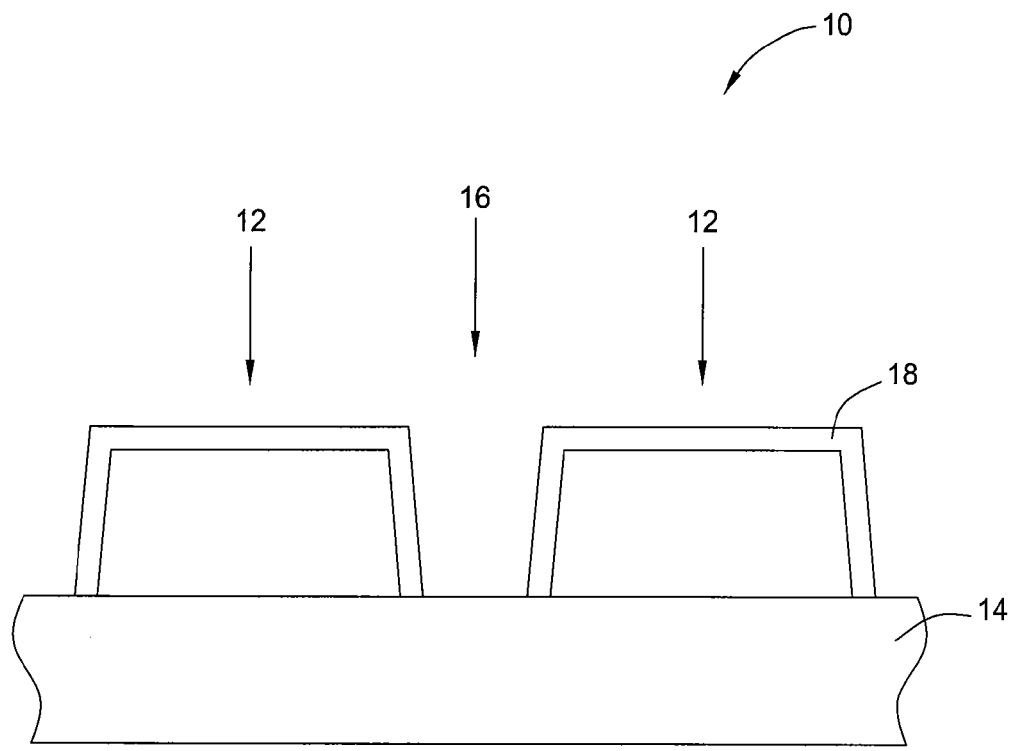
FIG. 1 illustrates adding a passivation layer to a semiconductor structure having at least two dies separated by a street in accordance with an embodiment of the invention.
Figure 1A:
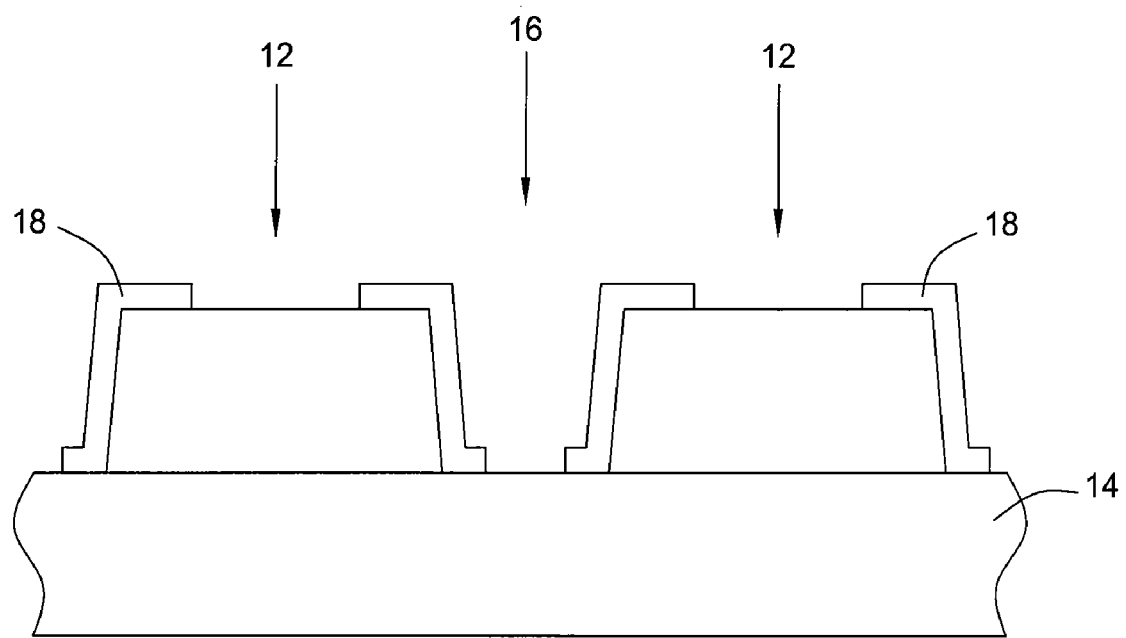
FIG. 1A illustrates removing portions of the passivation layer from the semiconductor structure in FIG. 1 in accordance with an embodiment of the invention.

Referring now to FIG. 1, a generic multilayered semiconductor structure 10 is provided with two different dies 12 disposed on a substrate 14 and separated by a street section, or simply "the street" 16. A passivation layer 18 may be deposited on the dies 12 with a portion of the passivation layer 18 removed as desired (e.g. for contact or grounding) for some embodiments as shown in FIG. 1A. The substrate 14 on which the dies 12 were formed may be composed of SiO2, sapphire, GaAs, InP, InGaAsP, Si, ZnO, or AlN.

Figure 2:
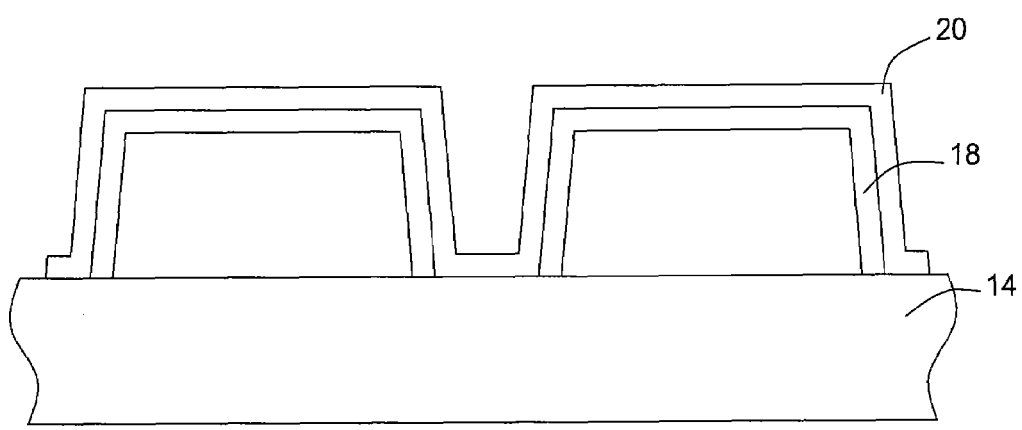
FIG. 2 illustrates forming a connected conductor above the semiconductor structure of FIG. 1 in accordance with an embodiment of the invention.

After passivation layers have been added with a portion of the passivation layers removed as desired, a connected conductor 20 may be deposited using at least one of several techniques including physical vapor deposition (PVD), evaporation, plasma spray, chemical vapor deposition (CVD), or electroless deposition to cover the entire semiconductor structure 10 of FIG. 1 (as illustrated in FIG. 2). From an initially deposited layer of the connected conductor 20, additional metal layers may be formed above in an effort to further protect the underlying layers for some embodiments. In multilayered implementations of the connected conductor 20, the individual metal layers may be composed of different metals, be formed using different techniques, and possess different thicknesses.

Figure 3:
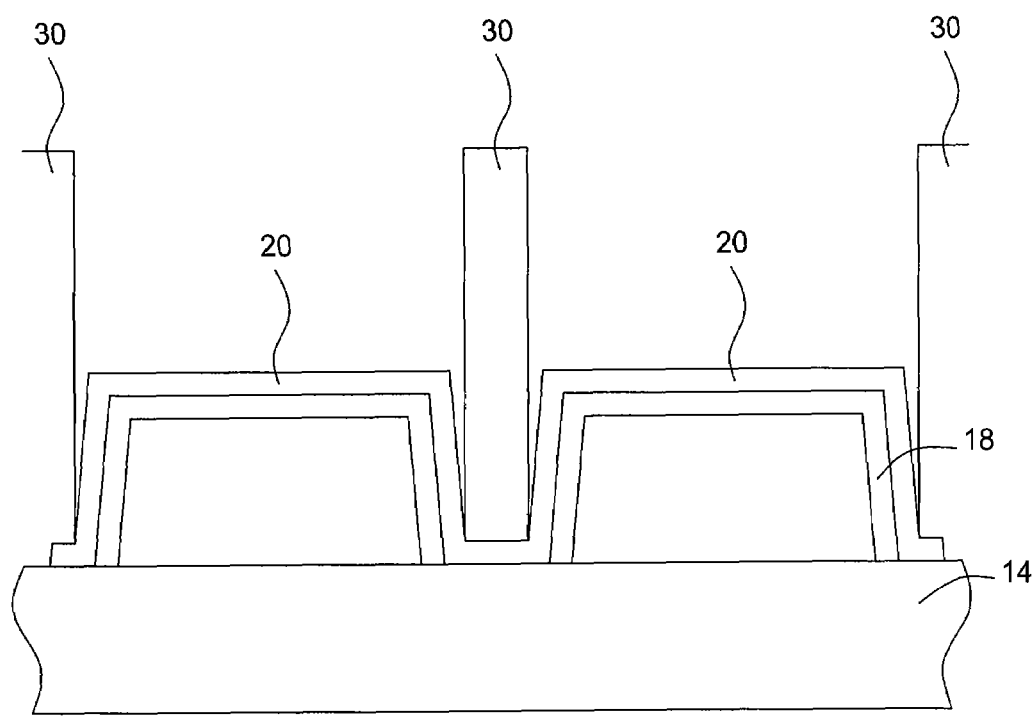
FIG. 3 illustrates adding a stop electroplating (EP) layer in the streets of the structure in FIG. 2 in accordance with an embodiment of the invention.

Once the desired number of metal layers has been created, a mass of material that resists electroplating (EP), referred to as the stop EP layer 30, may be formed using a mask or other suitable techniques and may most likely be positioned only above the street 16 as shown in FIG. 3. In this manner, the stop EP layer 30 blocks the growth of metal on the street 16. The stop EP layer 30 may be composed of a non-conductive material and may be photosensitive or non-photosensitive. Suitable material for the stop EP layer 30 may include a polymer, a polyimide, epoxy, a resist, thermoplastic, a parylene, a dry film resist, SU-8, or NR7. The thickness of the stop EP layer 30 is typically greater than 1 µm.

Figure 4:
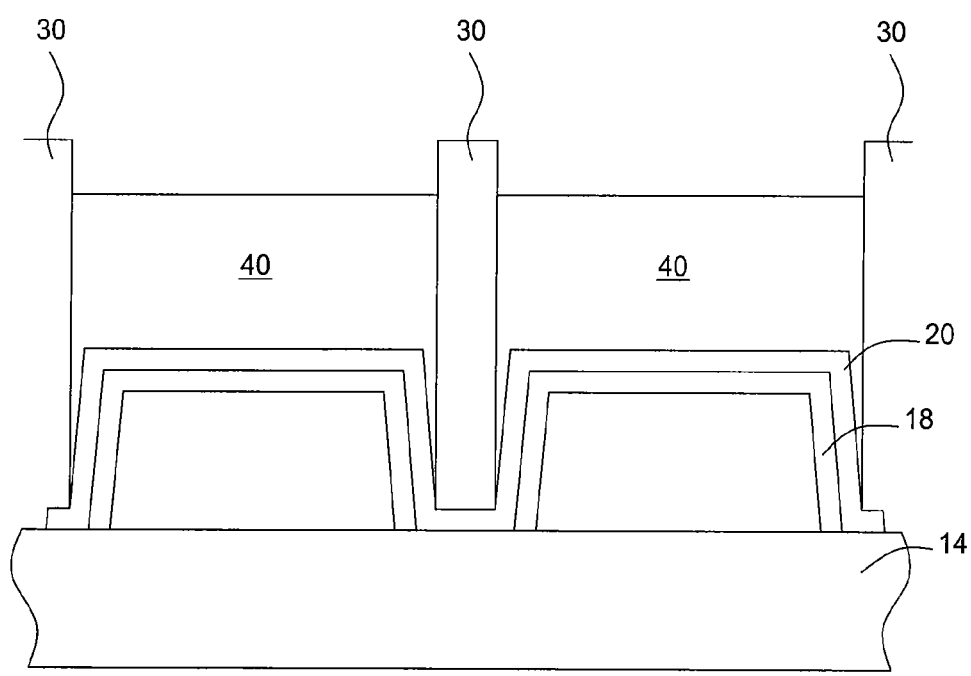
FIG. 4 illustrates depositing a conductive metal layer above the dies of FIG. 3 in accordance with an embodiment of the invention.
Figure 4A:
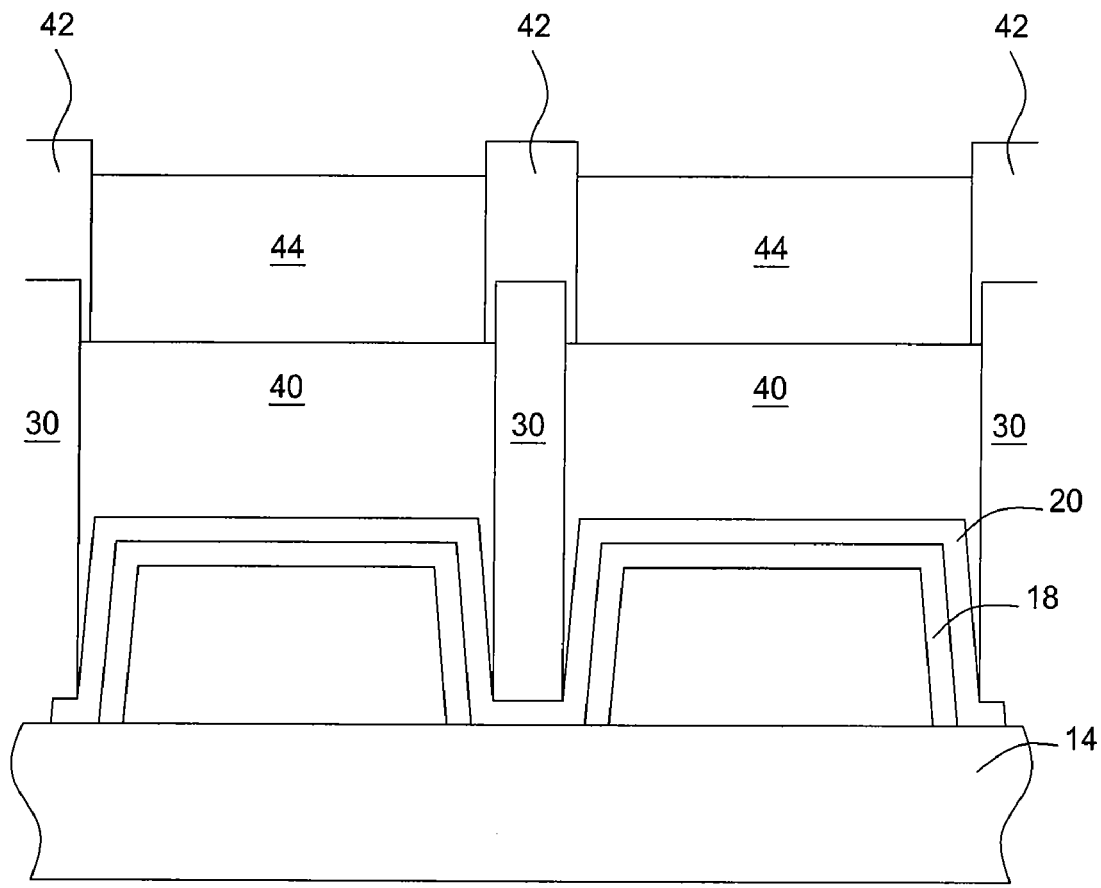
FIG. 4A illustrates adding an additional stop EP layer and an additional conductive metal layer above the structure of FIG. 4 in accordance with an embodiment of the invention.

Suitable deposition techniques, such as electroplating (EP) or electroless plating, may then be used to grow a conductive metal layer 40 above the semiconductor structure 10 as depicted in FIG. 4. Serving as a metal substrate for the dies 12, the conductive metal layer 40 may comprise a single layer or multiple layers, consisting of single metals or metal alloys in either case. The thickness of the conductive metal layer 40 may be greater than 1 µm, but should be controlled so that the conductive metal layer 40 on top of one die 12 is not connected to that above another die 12. It is possible to form a thicker conductive metal layer by forming additional stop EP layers 42 and conductive metal layers 44 above the initially formed layers 30, 40 as illustrated in FIG. 4A.

Figure 5:
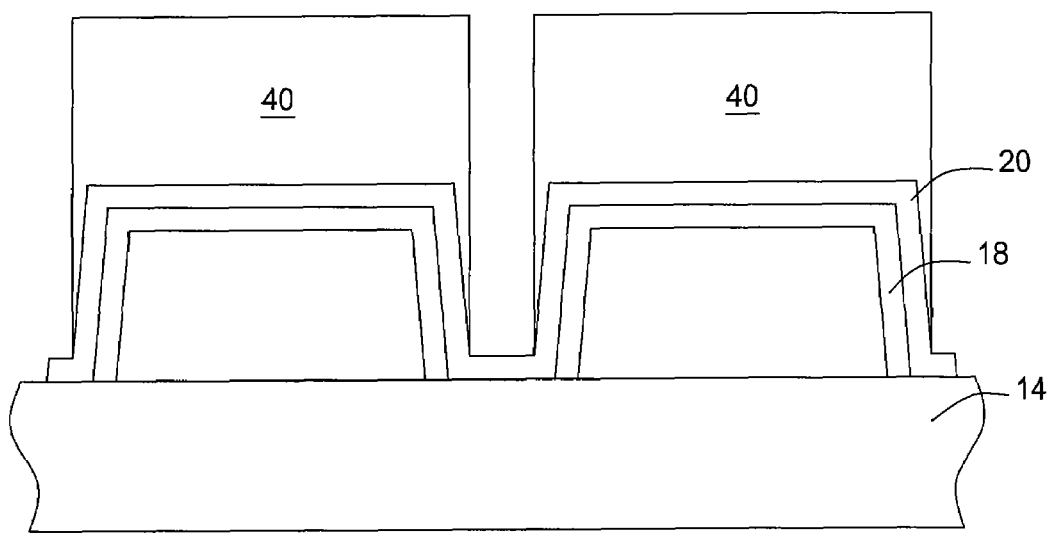
FIG. 5 illustrates removing the stop EP layer from the structure in FIG. 4 in accordance with an embodiment of the invention.
Figure 6:
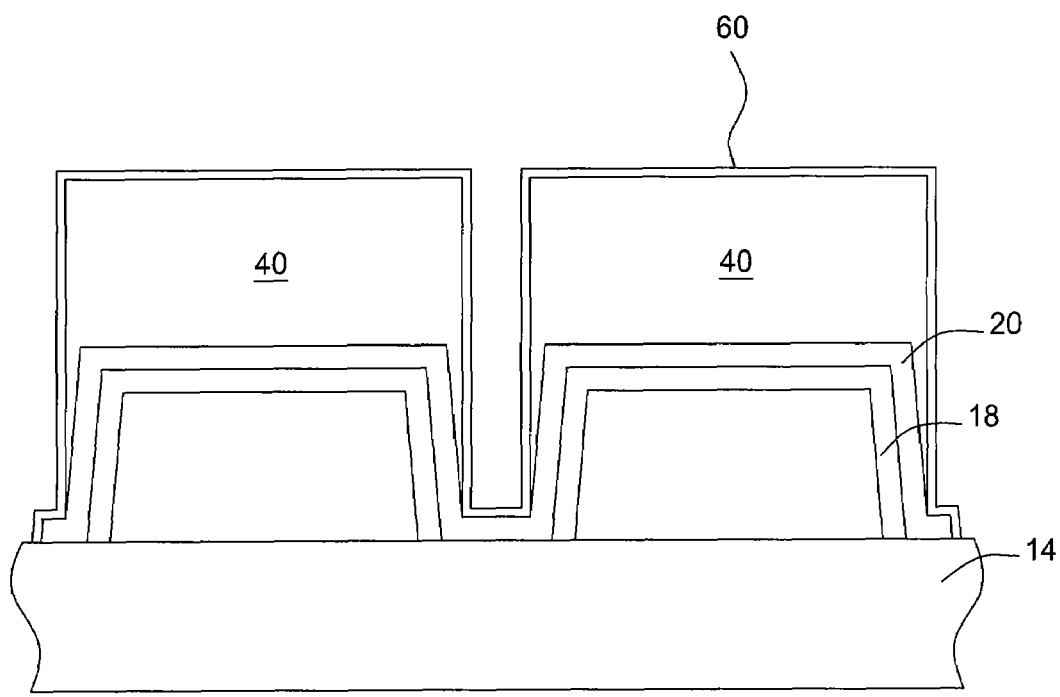
FIG. 6 illustrates forming a barrier layer above the structure in FIG. 5 in accordance with an embodiment of the invention.

Referring to FIG. 5, the stop EP layer 30 may be eradicated using, for example, wet etching. A barrier layer 60, which may comprise a single layer or multiple formed layers may then be formed covering the total area of the conductive metal layer 40 and the street 16, as portrayed in FIG. 6. For some embodiments, the street 16 may have other particular materials depending on the structure on which the barrier layer 60 may be deposited.

The barrier layer 60 may be a conductor (e.g., Cr/Au, Ni/Au, Ti/Au, Al/Ti, Ag/Ti, Cr/Au/Ti/Ni/Au, or Ti/Ni/Au), semiconductor (e.g., Si, GaAs, GaP, or InP), or insulator (e.g., a polymer, a polyimide, epoxy, a parylene, a resist, a dry film resist, thermoplastic, $SiO_2$, $Si_3N_4$, ZnO, $Ta_2O_5$, $TiO_2$, HfO, or MgO). The purpose of the barrier layer will be made clear below.

Figure 7:
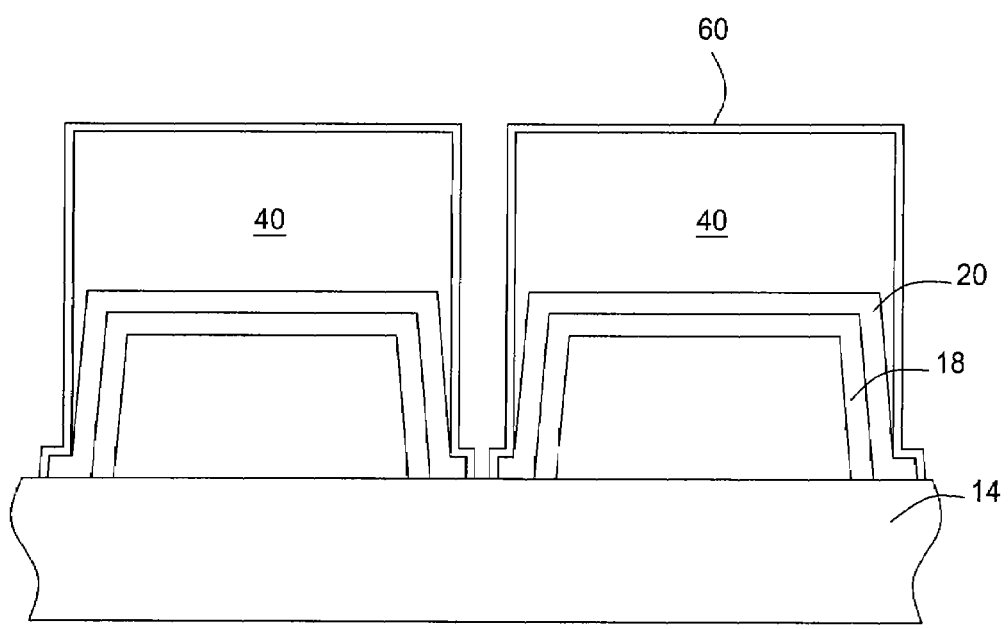
FIG. 7 illustrates removing a portion of the barrier layer, the connected conductor, and the passivation layer in the street of FIG. 6 in accordance with an embodiment of the invention.

Once the barrier layer 60 has been generated, a portion of the metals and barrier layer 60 above the street 16 may be removed (FIG. 7). The removal of the barrier layer 60, any intermediate metal layers, and the connected conductor 20 may be accomplished by any suitable means, such as dry etching (inductively coupled plasma/reactive ion etching, or ICP/RIE), laser cutting, saw cutting, wet etching, or a water jet.

Figure 8:
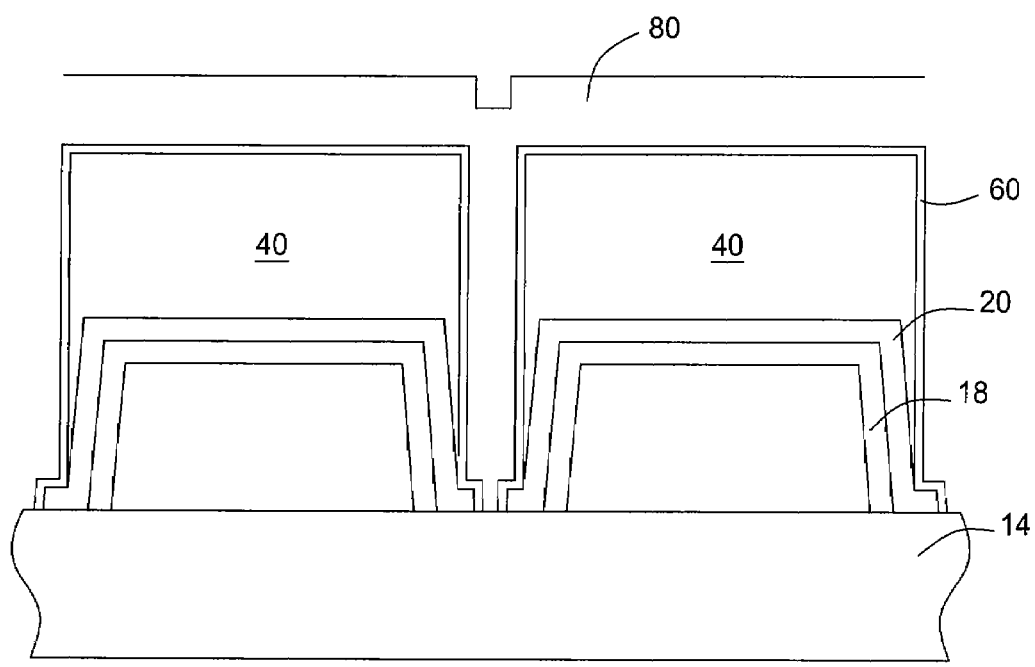
FIG. 8 illustrates adding a temporary sacrificial handling layer above the structure of FIG. 7 in accordance with an embodiment of the invention.

Referring to FIG. 8, a temporary sacrificial handling layer 80 may be formed covering the entire structure. The temporary sacrificial handling layer 80 may comprise any suitable type of material layers, such as conductor, semiconductor, or insulator layers. The thickness of the temporary sacrificial handling layer 80 is typically greater than 1 µm; the preferred thickness may be between 5 µm and 1000 µm.

Figure 8A:
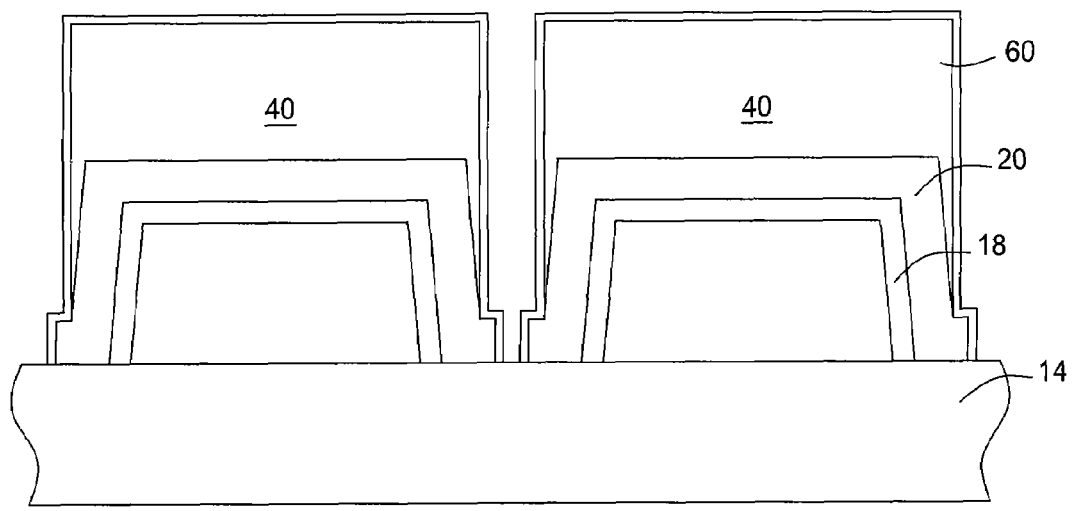
FIG. 8A illustrates providing a thickened connected conductor such that a temporary sacrificial handling layer may not be employed in accordance with an embodiment of the invention.

For some embodiments as illustrated in FIG. 8A, the thickness of the connected conductor 20 may be increased in an effort to bolster the structure and provide a sturdy frame for handling. The connected conductor thickness may be increased from that of FIG. 2, for example, by depositing an additional number of layers or by depositing more material in each of the layers. In such embodiments, a temporary sacrificial handling layer 80 may not be employed.

Figure 9:
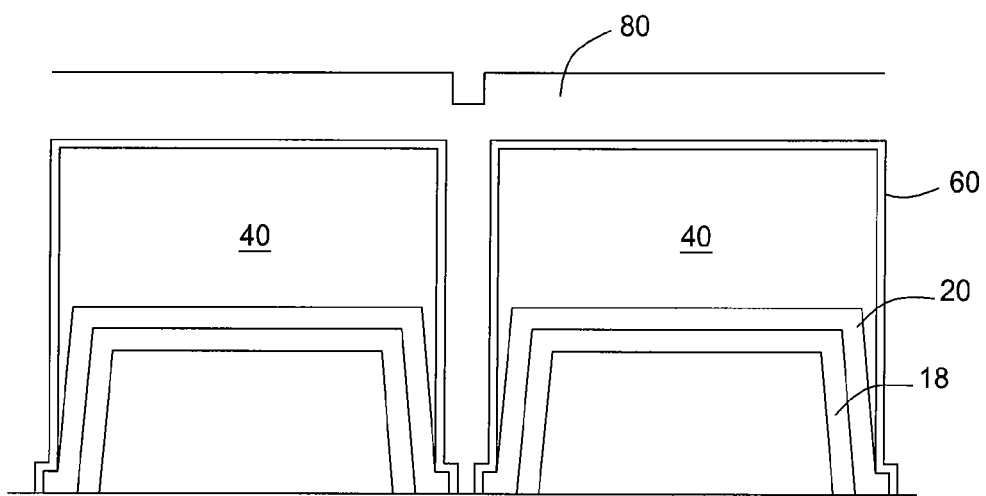
FIG. 9 illustrates removing the substrate from the structure of FIG. 8 in accordance with an embodiment of the invention.

Now that a second structure (the temporary sacrificial handling layer 80) has been added to hold the wafer assembly together during handling and die cutting, the substrate 14 may be removed as shown in FIG. 9. Removal of the substrate 14 may be accomplished by any suitable technique or combinations thereof, such as plasma etching, wet chemical etching, photo-enhanced chemical etching, laser lift-off, grinding, or polishing.

Figure 10:
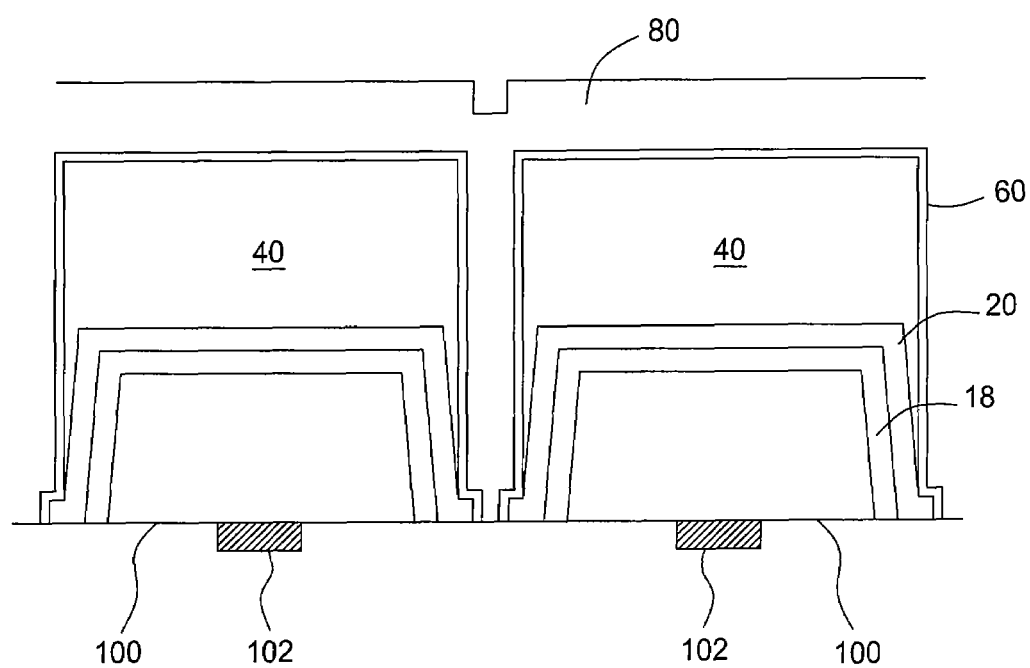
FIG. 10 illustrates adding bonding pads to the exposed bottom surface of the structure in FIG. 9 in accordance with an embodiment of the invention.

Once the substrate 14 has been removed, the bottom surface 100 of the device should be exposed and may be operated on as depicted in FIG. 10. Bonding pads 102 and any desired circuit pattern on the remaining semiconductor material may then be fabricated on the underside of the working structure.

Figure 11:
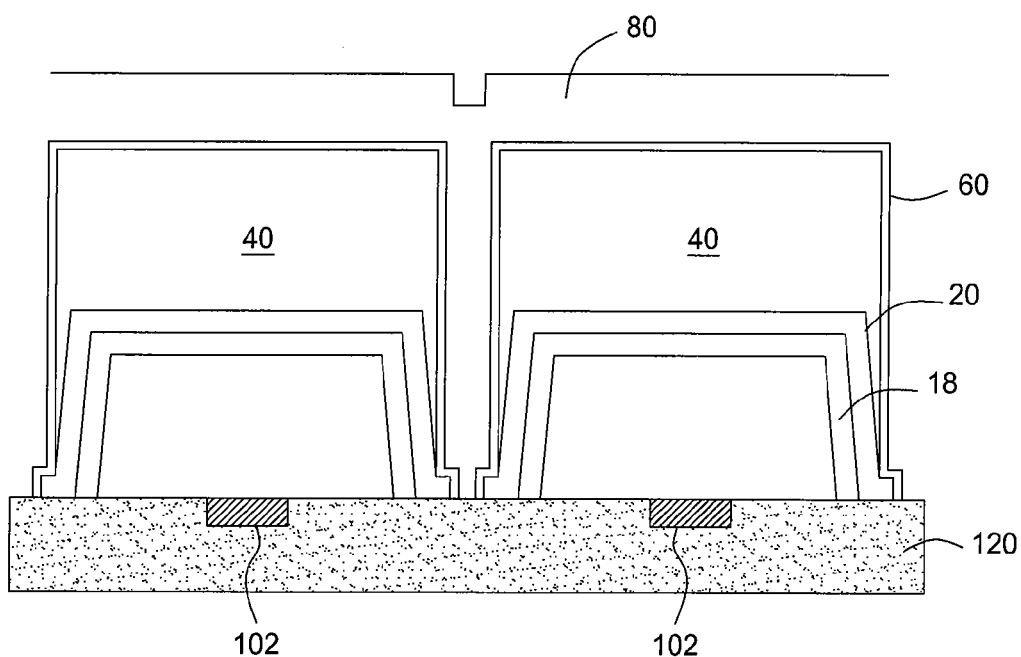
FIGS. 11 and 11A illustrate adding a protective layer and other materials to the structure of FIG. 10 in accordance with an embodiment of the invention.
Figure 11A:
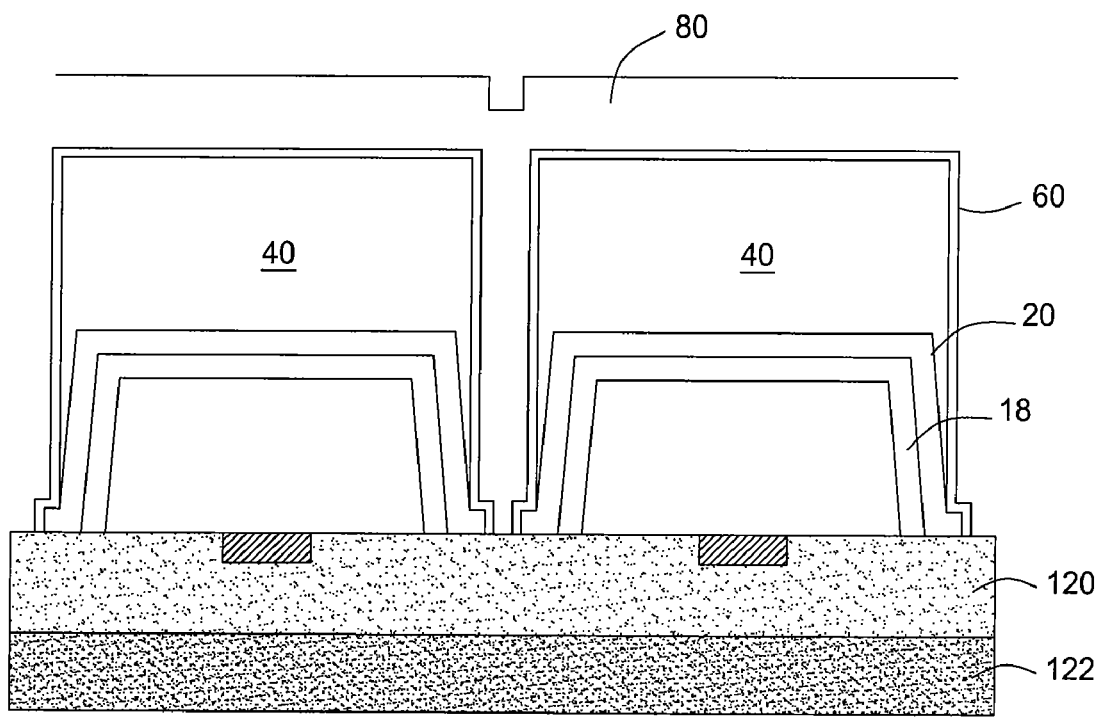

Afterwards, the bottom surface 100 of the semiconductor wafer assembly with patterning and bonding pads 102 may be treated with tape, wax, epoxy, or other materials or a combination of materials forming a protective layer 120, as illustrated in FIG. 11. The protective layer 120 is typically greater than 1 µm and may comprise a conductor (e.g., Cr/Au, Ni/Au, Ti/Au, Al/Ti/Ag/Ti, Ti/Au, Cr/Au/Ti/Ni/Au, or Ti/Ni/Au), a semiconductor (e.g., Si, GaAs, GaP, or InP), or an insulator (a polymer, a polyimide, epoxy, a parylene, a resist, a dry film resist, thermoplastic, $SiO_2$, $Si_3N_4$, ZnO, $Ta_2O_5$, $TiO_2$, HfO, or MgO) or a combination of these materials. As shown in FIG. 11A, one could also attach other materials 122 to the protective layer 120 to enhance handling (e.g., sapphire, Si, Mo, Cu, or Al).

Figure 12:
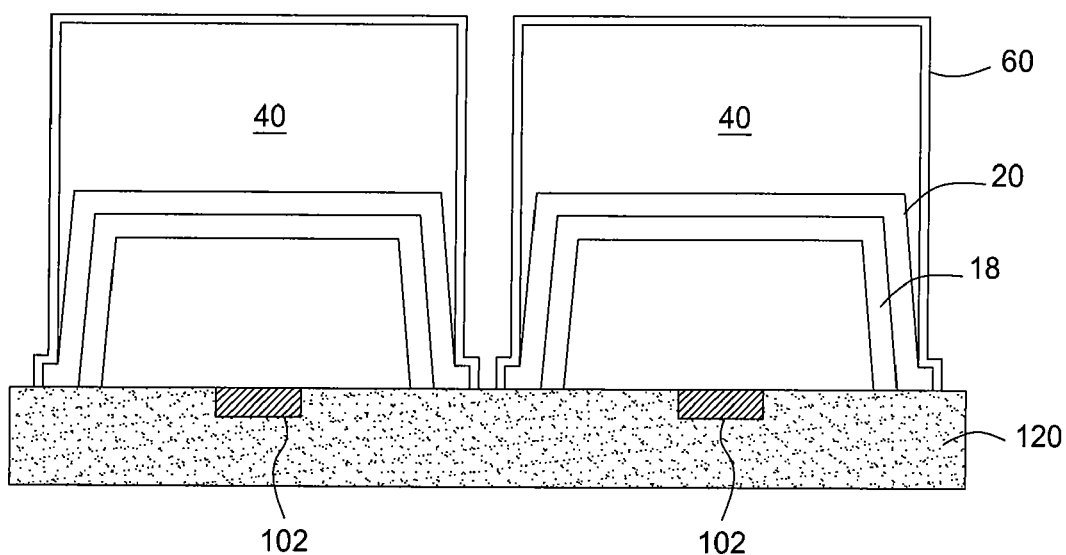
FIG. 12 illustrates removing the temporary sacrificial handling layer from the structure of FIG. 11 in accordance with an embodiment of the invention.

Because the individual semiconductor dies 12 already having the intended conductive metal layers 40 and the bonding pads 102 and/or circuitry are held together by the protective layer 120, the temporary sacrificial handling layer 80 may no longer be necessary. For some embodiments, to remove this handling layer 80, chemical solutions such as acid, (e.g., $H_3PO_4$, $HNO_3$, or $H_2SO_4$), alkaline (e.g., KOH or NaOH), solvent, or an oxidizer-containing solution (e.g., $H_2O_2$, $FeCl_3$, or KClO), may be used to remove the temporary sacrificial handling layer 80 down to the barrier layer 60. The barrier layer 60 may prevent further chemical damage to the remainder of the wafer assembly as the temporary sacrificial handling layer 80 is removed. The chemical solution may also be selected to remove the temporary sacrificial handling layer 80 at a much faster rate than the barrier layer 60 and protective layer 120 such that the conductive metal layer 40, the dies 12, and their bond pad 102 and circuitry remain intact after the temporary sacrificial handling layer 80 is removed. The result showing individual dies 12 can be seen in FIG. 12.

Figure 13:
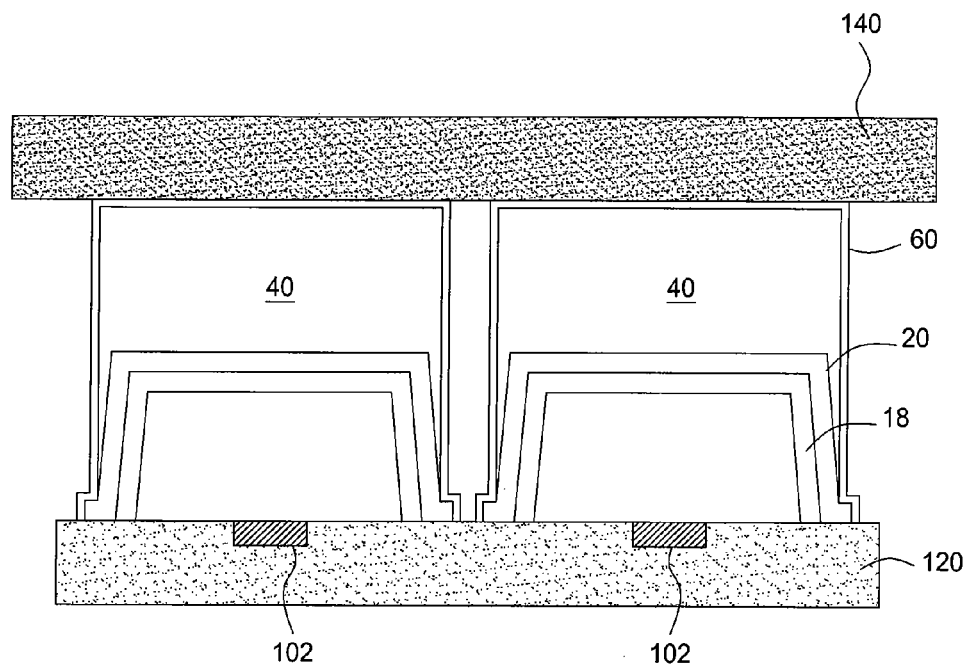
FIG. 13 illustrates adding an adhesive expandable material to the structure of FIG. 12 in accordance with an embodiment of the invention.
Figure 14:
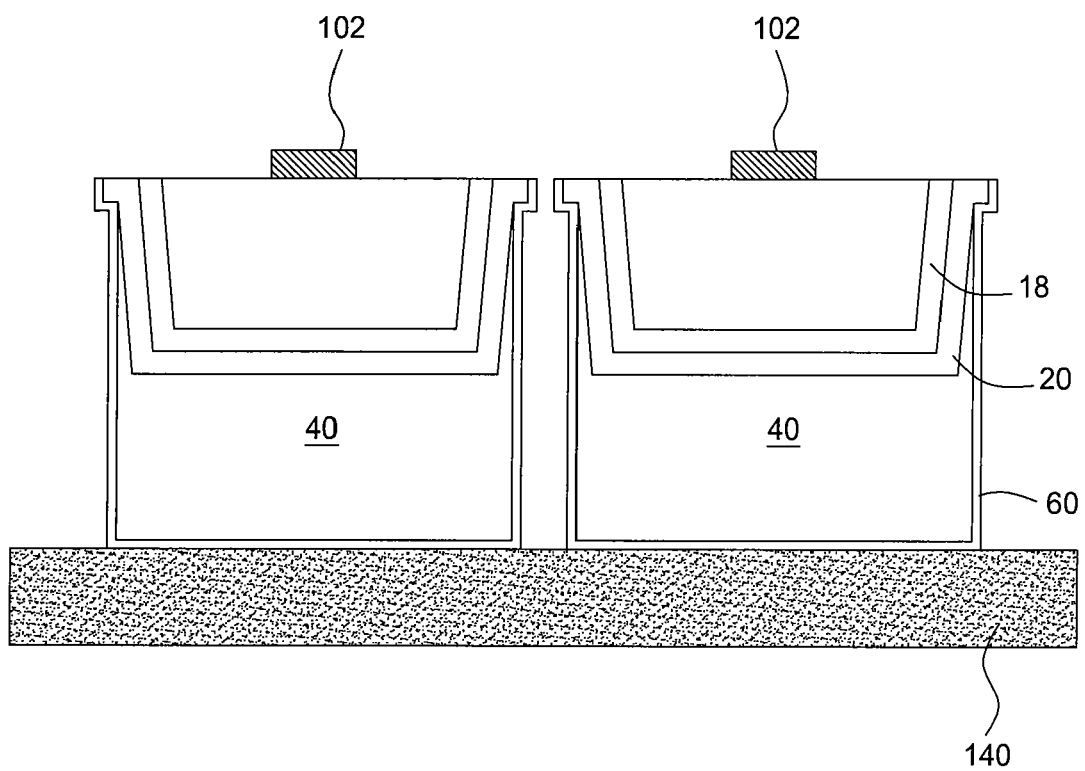
FIG. 14 illustrates flipping the structure of FIG. 13 over and removing the protective layer in accordance with an embodiment of the invention.
Figure 15:
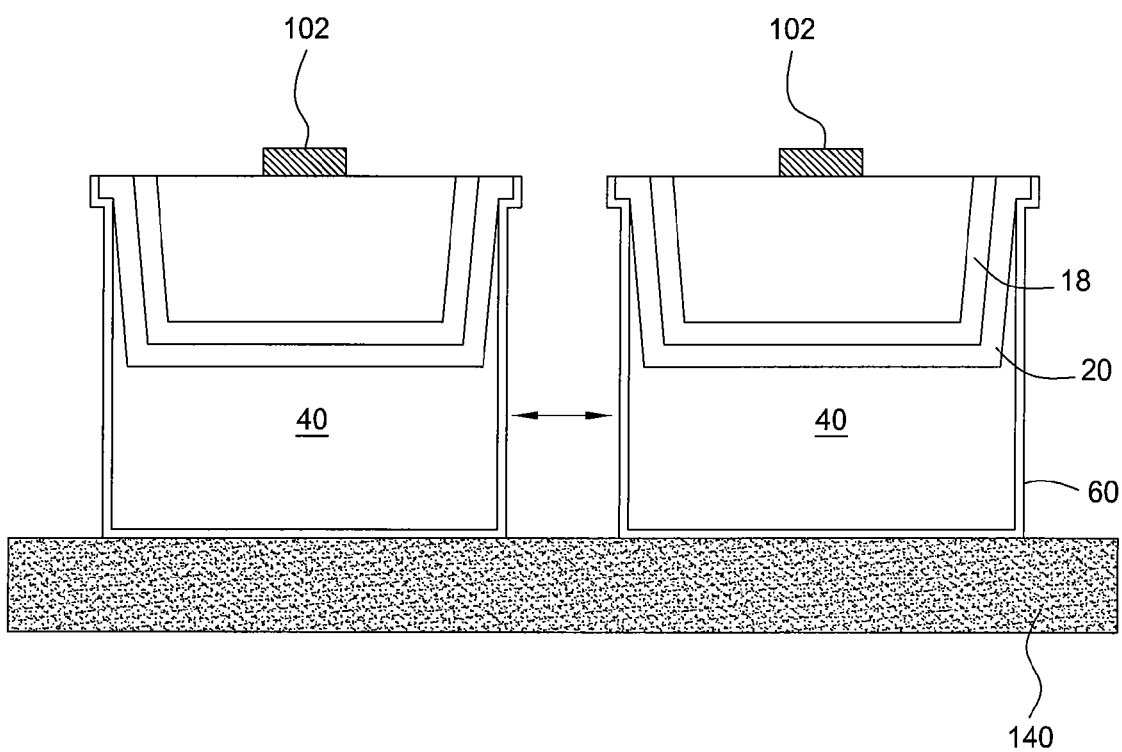
FIG. 15 illustrates expansion of the adhesive expandable material of FIG. 14 in accordance with an embodiment of the invention.

Referring now to FIG. 13, an adhesive expandable material 140 may be added to the surface of the barrier layer 60. This adhesive expandable material 140 is usually a type of tape, and may comprise metal tape or an ultraviolet-curable adhesive tape known as UV tape. Next, the protective layer 120 may be removed, the structure may be flipped over (FIG. 14), and the tape may be optionally expanded to further separate the semiconductor dies 12 to achieve a desired separation distance (FIG. 15).

An Exemplary Method of Separating VLED Dies

Now that one embodiment of the present invention has been described, a similar separation method as disclosed herein will be applied to a wafer having multiple vertical light-emitting diode (VLED) dies as a particular, but not limiting, application example.

Figure 16A:
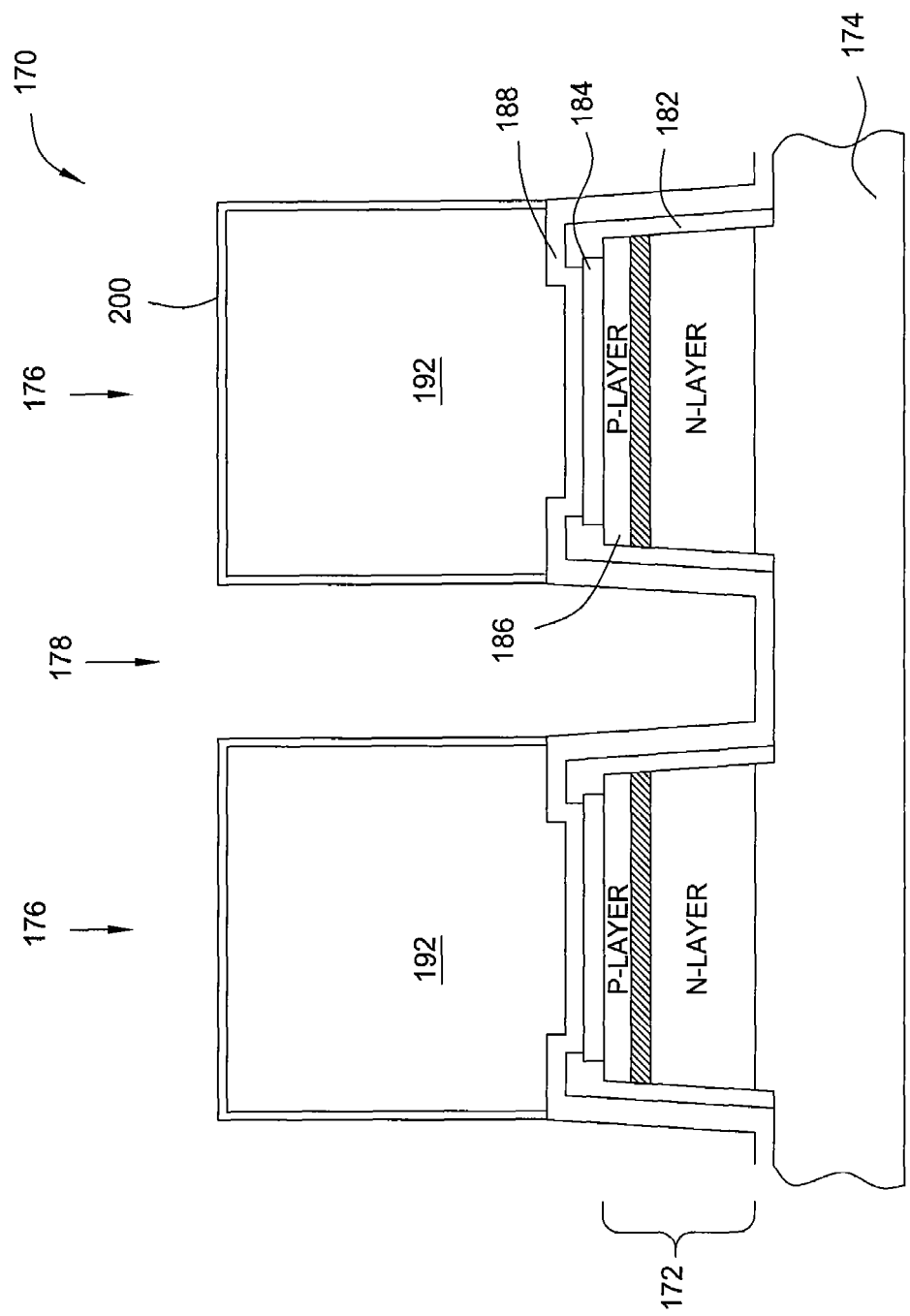
FIG. 16A illustrates a vertical light-emitting diode (VLED) structure comprising two LED stacks on a wafer wherein a stop EP layer has been added in the streets of the VLED structure, a conductive metal layer was deposited above the LED stacks, the stop EP layer was removed, and a barrier layer was added above the VLED structure in accordance with an embodiment of the invention.

Referring to FIG. 16A, a multilayered epitaxial structure 170 is provided depicting two vertical gallium nitride (GaN) p-n junctions (referred to as LED stacks 172) that have been grown on a substrate 174 and compose part of the VLED dies 176. The substrate 174 may be composed of sapphire. A street 178 may be disposed between the dies 176.

After passivation layers 182 may have been added to protect the dies 176 and contacts (not shown) have been formed to make connections to the mirror layer 184 (disposed above and coupled to the p-GaN layer 186), a seed metal layer 188 may be deposited using several techniques including physical vapor deposition, evaporation, plasma spray, chemical vapor deposition or electroless deposition as described above. The seed metal layer 188 may be composed of Cr/Au, Cr/Au/Ni/Au, Cr/Au/Ti/Ni/Au, Ti, Ti/Au, Ti/Ni/Au, or Ni/Au. From this seed metal layer 188, additional metal layers may be formed above in an effort to further protect the underlying layers. In multilayered implementations, the individual metal layers may be composed of different metals, be formed using different techniques, and possess different thicknesses.

Once the desired number of metal layers has been created, a stop EP layer (not shown), may be formed using a mask or other suitable techniques and may most likely be positioned only above the street 178 in an effort to block the growth of metal on the street 178. The stop EP layer may be composed of a non-conductive material and may be photosensitive or non-photosensitive. Suitable material for the stop EP layer may include a polymer, a polyimide, epoxy, a resist, thermoplastic, a parylene, a dry film resist, SU-8, or NR7. The thickness of the stop EP layer is typically greater than 1 µm.

Suitable deposition techniques, such as electroplating (EP) or electroless plating may then be used to grow a conductive metal layer 192 above the semiconductor structure 170 as depicted in FIG. 16A. Serving as a metal substrate for the VLED dies 176, the conductive metal layer 192 may comprise a single layer or multiple layers, consisting of single metals or metal alloys in either case. The thickness of the conductive metal layer 192 is typically greater than 1 µm, but should be controlled so that the conductive metal layer on top of one die 176 is not connected to that above another die 176. The preferred thickness of the conductive metal layer 192 is typically between 5 µm and 1000 µm.

The stop EP layer may have been eradicated using, for example, wet etching. A barrier layer 200, composed of a single layer or multiple formed layers, may then be formed through deposition (e.g., PVD, CVD, e-beam electroplating, or electroless plating), spraying, or coating to cover the total area of the conductive metal layer 192 and the street 178. The barrier layer 200 may comprise any suitable material, such as Cr/Au, Ni/Au, Ti/Au, Al/Ti, Ag/Ti, Ti/Au, Cr/Au/Ti/Ni/Au, or Ti/Ni/Au.

Figure 16B:
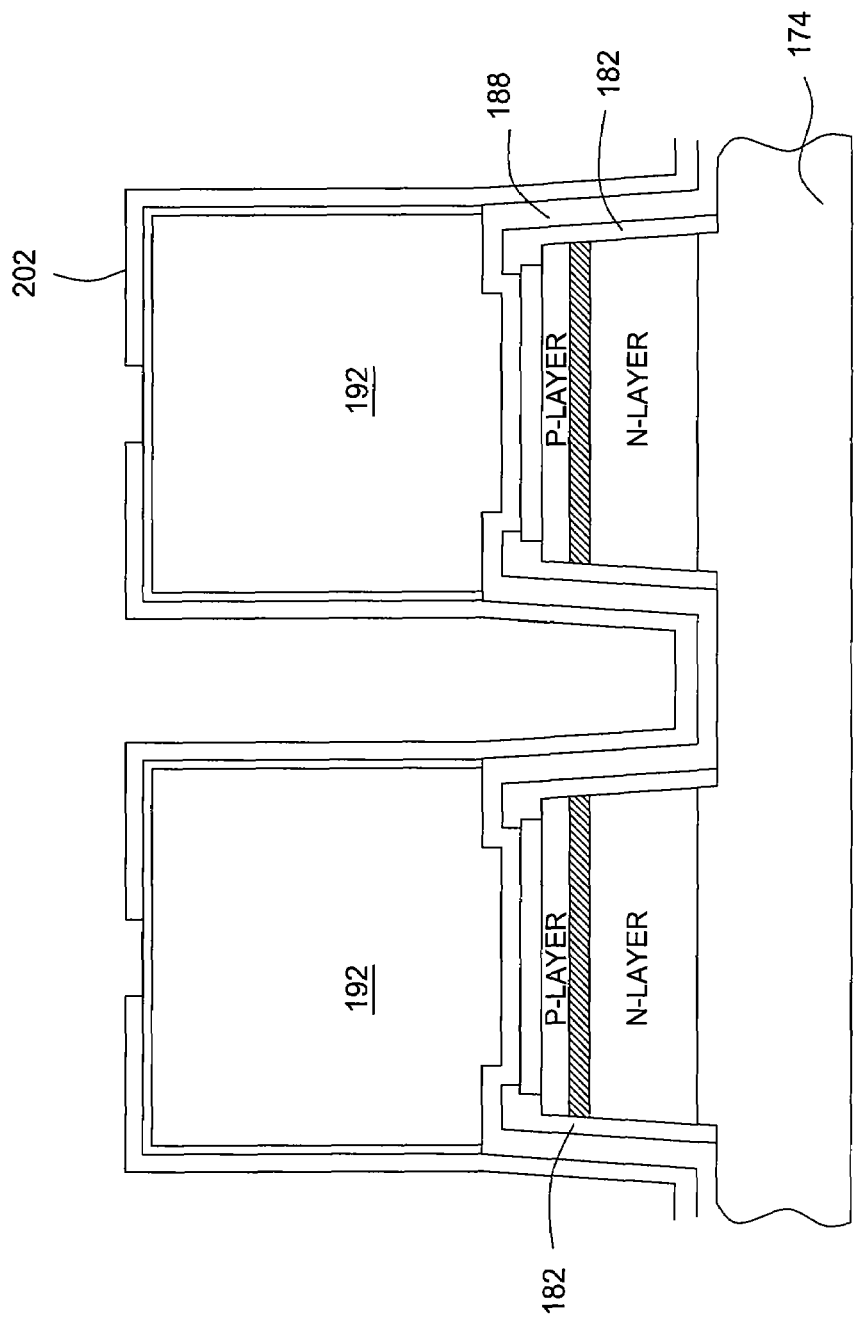
FIGS. 16B-C illustrate forming an additional barrier layer above the barrier layer in FIG. 16A in accordance with embodiments of the invention.
Figure 16C:
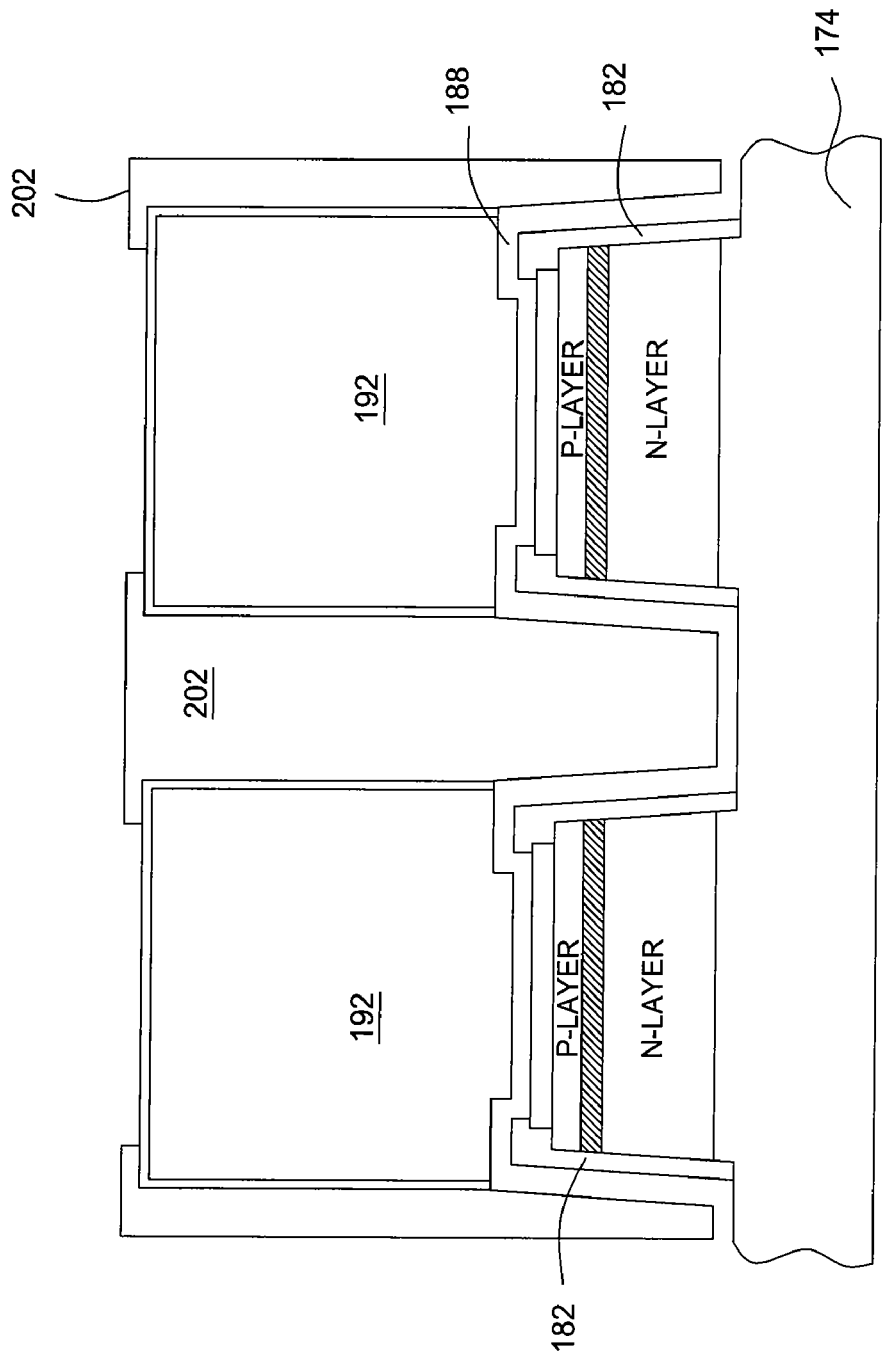

For some embodiments, an additional barrier layer 202 may be formed and patterned above the barrier layer 200 as illustrated in FIGS. 16B and 16C. Referring to FIG. 16C, the additional barrier layer 202 may completely fill in the volume above the street 178 for some embodiments. The additional barrier layer 202 may comprise a non-conductive material and may be photosensitive or non-photosensitive. Suitable material for the additional barrier layer 202 may include a polymer, a polyimide, epoxy, a resist, thermoplastic, a parylene, a dry film resist, SU-8, or NR7.

Once the barrier layer 200 has been generated, portion of the metals on the street 178 may be removed. The removal of portions of the barrier layer 200, any intermediate metal layers, and the seed metal layer 188 on the street 178 may be accomplished by any suitable technique, such as dry etching (ICP/RIE), laser cutting, saw cutting, wet etching, or a water jet. In some cases, the removal process may also fully or partially cut through the material on the street 178. For some embodiments, the removal process may cut into the substrate 174.

Figure 17:
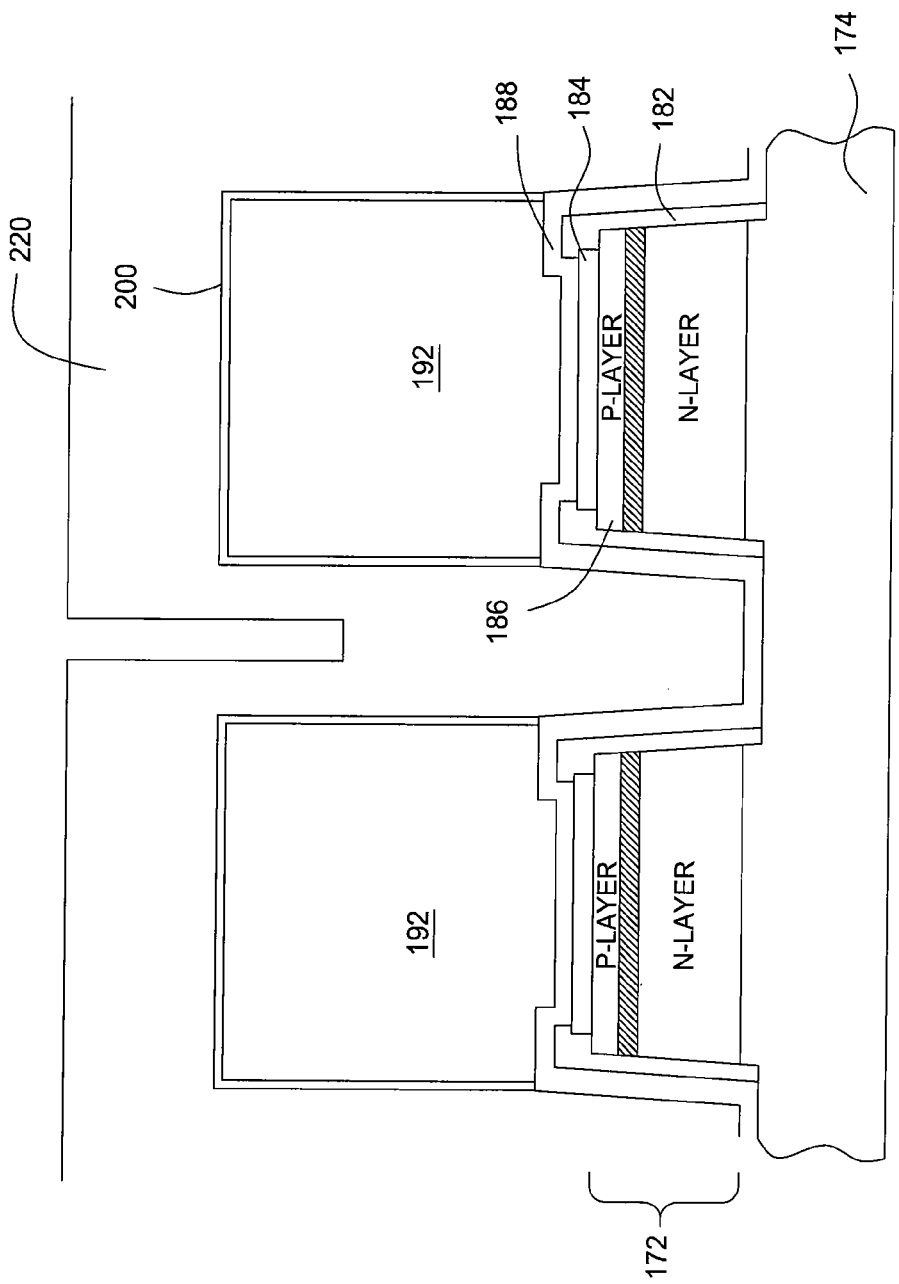
FIG. 17 illustrates adding a sacrificial metal element above the VLED structure of FIG. 16A in accordance with an embodiment of the invention.

Referring to FIG. 17, a sacrificial metal element 220 for handling may be grown, for example, via PVD, CVD, evaporation, plasma spray, electroplating, or electroless plating. The sacrificial metal element 220 may comprise a single layer or multiple layers, consisting of single metals or metal alloys in either case. Possibilities include Cu, Ni, Mo, W, Co, Pd, Pt, Ag, doped polysilicon Ni—Co, Ag, Au, Cu—Co, Cu—Mo, Ni/Cu, Cu/Ni—Co/Cu, Cu/Ni—Co/Cu/Ni—Co, and Ni/Cu—Mo or their alloys. The thickness of the metal layers composing the sacrificial metal element 220 is typically between 5 μm and 1000 um.

Now that a second structure (the sacrificial metal element 220) may have been added to hold the wafer assembly together during handling and die cutting, the substrate 174 may be removed by any suitable means, such as single pulse laser irradiation, a selected photo-enhanced chemical etching of the interfacial layer between the substrate 174 and GaN, plasma etching, grinding, polishing, or wet etching.

Once the substrate 174 has been removed, the bottom surface of the multilayered epitaxial structure should be exposed and may be operated on. Any desired n-type bonding pads and/or circuit pattern on the remaining n-GaN may then be fabricated on the underside of the wafer assembly. With the sacrificial metal element 220 electrically coupled to all of the p-GaN areas on the wafer, LED devices having n-type bonding pads may then be probed using the sacrificial metal element 220 as a common test point.

The bottom surface of the wafer assembly may be passivated by a protective layer as described above, for example, in an effort to hold the individual VLED dies 176 together. Therefore, the sacrificial metal element 220 may no longer be necessary and may be removed. An adhesive expandable material, such as tape, may be added to the surface of the barrier layer 200 as described above, and then the protective layer may be removed. The adhesive expandable material may be optionally expanded to further separate the VLED dies 176 in an effort to achieve a desired separation distance as described above.

While the foregoing is directed to embodiments of the present invention, other and further embodiments of the invention may be devised without departing from the basic scope thereof, and the scope thereof is determined by the claims that follow.

What is claimed is:

1. A method of fabricating a plurality of semiconductor dies, comprising:
   forming one or more semiconductor layers on a substrate;
   defining the plurality of semiconductor dies separated by streets in the semiconductor layers;
   depositing a plurality of metal layers above the semiconductor layers;
   removing at least a portion of the metal layers disposed in the streets;
   forming a first handling layer above the metal layers;
   removing the substrate to expose a surface of the semiconductor layers;
   adding a second handling layer to the exposed surface of the semiconductor layers;
   removing the first handling layer to expose a surface of the metal layers;
   applying an adhesive to the exposed surface of the metal layers; and
   removing the second handling layer.

2. The method of claim 1, further comprising expanding the adhesive to separate the plurality of dies to a desired separation distance.

3. The method of claim 1, further comprising forming stop electroplating (EP) areas in the streets before depositing the metal layers.

4. The method of claim 3, wherein the stop EP areas comprise at least one of a polymer, a polyimide, epoxy, a resist, thermoplastic, a parylene, a dry film resist, SU-8, or NR7.

5. The method of claim 3, further comprising removing the stop EP areas after depositing the metal layers.

6. The method of claim 5, wherein removing the stop EP areas comprises wet etching.

7. The method of claim 1, wherein the substrate comprises sapphire, $SiO_2$, GaAs, InP, InGaAsP, Si, ZnO, or AlN.

8. The method of claim 1, wherein depositing the metal layers comprises at least one of physical vapor deposition (PVD), evaporation, plasma spray, chemical vapor deposition (CVD), and electroless deposition.

9. The method of claim 1, wherein removing the at least a portion of the metal layers disposed in the streets comprises at least one of dry etching (inductively coupled plasma/reactive ion etching (ICP/RIE)), laser cutting, saw cutting, wet etching, and applying a water jet.

10. The method of claim 1, wherein the first handling layer comprises at least one of Cu, Ni, Mo, W, Co, Pd, Pt, Ag, doped polysilicon Ni—Co, Ag, Au, Cu—Co, Cu—Mo, Ni/Cu, Cu/Ni—Co/Cu, Cu/Ni—Co/Cu/Ni—Co, Ni/Cu—Mo, and alloys thereof.

11. The method of claim 1, wherein the thickness of the first handling layer is between 5 μm and 1000 μm.

12. The method of claim 1, wherein removing the substrate comprises at least one of plasma etching, wet chemical etching, photo-enhanced chemical etching, laser lift-off, grinding, and polishing.

13. The method of claim 1, wherein the second handling layer comprises at least one of Cr/Au, Ni/Au, Ti/Au, Al/Ti/Ag/Ti, Ti/Au, Cr/Au/Ti/Ni/Au, Ti/Ni/Au, Si, GaAs, GaP, InP, a polymer, a polyimide, epoxy, a parylene, a resist, a dry film resist, thermoplastic, $SiO_2$, $Si_3N_4$, ZnO, $Ta_2O_5$, $TiO_2$, HfO, MgO, and combinations thereof.

14. The method of claim 1, wherein removing the first handling layer comprises applying a chemical solution to the first handling layer.

15. The method of claim 14, wherein the chemical solution comprises at least one of $H_3PO_4$, $HNO_3$, $H_2SO_4$, KOH, NaOH, $H_2O_2$, $FeCl_3$, and KClO.

16. The method of claim 1, wherein the adhesive comprises ultraviolet-curable (UV) tape or metal tape.

17. The method of claim 1, further comprising depositing a passivation layer above the semiconductor layers before depositing the metal layers.

18. The method of claim 1, further comprising adding bonding pads or circuit patterns to the exposed surface of the semiconductor layers.

19. The method of claim 1, further comprising attaching a third handling layer to the second handling layer to enhance handling.

20. The method of claim 19, wherein the third handling layer comprises at least one of sapphire, Si, Mo, Cu, and Al.

21. The method of claim 1, wherein the plurality of semiconductor dies is a plurality of vertical light-emitting diode (VLED) dies.

22. A method of fabricating a plurality of semiconductor dies, comprising:
  forming one or more semiconductor layers on a substrate;
  defining the plurality of semiconductor dies separated by streets in the semiconductor layers;
  depositing a plurality of metal layers above the semiconductor layers;
  depositing a barrier layer above the metal layers;
  removing at least a portion of the barrier layer and the metal layers disposed in the streets;
  forming a first handling layer above the barrier layer;
  removing the substrate to expose a surface of the semiconductor layers;
  adding a second handling layer to the exposed surface of the semiconductor layers;
  removing the first handling layer to expose the barrier layer;
  applying an adhesive to the barrier layer; and
  removing the second handling layer.

23. The method of claim 22, wherein the barrier layer is a conductor comprising at least one of Cr/Au, Ni/Au, Ti/Au, Al/Ti, Ag/Ti, Cr/Au/Ti/Ni/Au, and Ti/Ni/Au.

24. The method of claim 22, wherein the barrier layer is a semiconductor comprising at least one of Si, GaAs, GaP, and InP.

25. The method of claim 22, wherein the barrier layer is an insulator comprising at least one of a polymer, a polyimide, epoxy, a parylene, a resist, a dry film resist, thermoplastic, $SiO_2$, $Si_3N_4$, ZnO, $Ta_2O_5$, $TiO_2$, HfO, and MgO.

26. The method of claim 22, wherein removing the first handling layer comprises applying a chemical solution to the first handling layer selected such that the first handling layer is removed at a faster rate than the barrier layer or the second handling layer.

27. The method of claim 22, further comprising forming stop electroplating (EP) areas in the streets before depositing the metal layers, wherein the stop EP areas discourage metal deposition in at least portions of the streets.

28. The method of claim 27, further comprising removing the stop EP areas after depositing the metal layers.

29. A method of fabricating a plurality of semiconductor dies, comprising:
  forming one or more semiconductor layers on a substrate;
  defining the plurality of semiconductor dies separated by streets in the semiconductor layers;
  depositing one or more connected conductor layers above the semiconductor layers;
  forming stop electroplating (EP) areas in the streets;
  depositing a plurality of metal layers above the connected conductor layers, wherein the stop EP areas discourage metal deposition in at least portions of the streets;
  removing the stop EP areas;
  removing at least a portion of the connected conductor layers disposed in the streets;
  forming a first handling layer above the metal layers;
  removing the substrate to expose a surface of the semiconductor layers;
  adding a second handling layer to the exposed surface of the semiconductor layers;
  removing the first handling layer to expose a surface of the metal layers;
  applying an adhesive to the exposed surface of the metal layers; and
  removing the second handling layer.

30. The method of claim 29, wherein depositing the connected conductor layers comprises at least one of physical vapor deposition (PVD), evaporation, plasma spray, chemical vapor deposition (CVD), and electroless deposition.

31. A method of fabricating a plurality of semiconductor dies, comprising:
  forming one or more semiconductor layers on a substrate;
  defining the plurality of semiconductor dies separated by streets in the semiconductor layers;
  depositing one or more connected conductor layers above the semiconductor layers;
  forming stop electroplating (EP) areas in the streets;
  depositing a plurality of metal layers above the connected conductor layers,
  wherein the stop EP areas discourage metal deposition in at least portions of the streets; and
  removing the stop EP areas.

32. The method of claim 31, further comprising depositing a barrier layer to protect the connected conductor layers and the metal layers.

33. The method of claim 31, further comprising removing the substrate to expose a surface of the semiconductor layers.

34. The method of claim 31, further comprising adding bonding pads or circuit patterns to the exposed surface of the semiconductor layers.

35. The method of claim 31, wherein the stop EP areas comprise at least one of a polymer, a polyimide, epoxy, a resist, thermoplastic, a parylene, a dry film resist, SU-8, or NR7.

36. The method of claim 31, wherein the barrier layer is a conductor comprising at least one of Cr/Au, Ni/Au, Ti/Au, Al/Ti, Ag/Ti, Cr/Au/Ti/Ni/Au, and Ti/Ni/Au.

37. The method of claim 31, wherein the barrier layer is a semiconductor comprising at least one of Si, GaAs, GaP, and InP.

38. The method of claim 31, wherein the barrier layer is an insulator comprising at least one of a polymer, a polyimide, epoxy, a parylene, a resist, a dry film resist, thermoplastic, $SiO_2$, $Si_3N_4$, ZnO, $Ta_2O_5$, $TiO_2$, HfO, and MgO.

39. A method of fabricating a plurality of semiconductor dies, comprising:
  forming one or more semiconductor layers on a substrate;
  defining the plurality of semiconductor dies separated by streets in the semiconductor layers;
  depositing one or more connected conductor layers above the semiconductor layers;
  forming stop electroplating (EP) areas in the streets;
  depositing a plurality of metal layers above the connected conductor layers,
  wherein the stop EP areas discourage metal deposition in at least portions of the streets;
  removing the stop EP areas;
  depositing a barrier layer to protect the connected conductor layers and the metal layers; and
  removing the substrate to expose a surface of the semiconductor layers.

* * * * *